United States Patent
Lee et al.

(10) Patent No.: US 10,365,744 B2
(45) Date of Patent: Jul. 30, 2019

(54) SENSING UNIT FOR SENSING TOUCH, DISPLAY INCLUDING SENSING UNIT, AND METHOD FOR MANUFACTURING THE SAME

(71) Applicant: LG DISPLAY CO., LTD., Seoul (KR)

(72) Inventors: Yangsik Lee, Paju-si (KR); JiHyun Jung, Paju-si (KR); DeukSu Lee, Goyang-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 15/851,373

(22) Filed: Dec. 21, 2017

(65) Prior Publication Data

US 2018/0348932 A1 Dec. 6, 2018

(30) Foreign Application Priority Data

Jun. 1, 2017 (KR) .................. 10-2017-0068425

(51) Int. Cl.
  *G06F 3/041* (2006.01)
  *G06F 3/044* (2006.01)
  *H01L 27/32* (2006.01)

(52) U.S. Cl.
  CPC ............ *G06F 3/0412* (2013.01); *G06F 3/044* (2013.01); *G06F 3/0416* (2013.01); *G06F 3/0418* (2013.01); *G06F 2203/04103* (2013.01); *G06F 2203/04111* (2013.01); *G06F 2203/04112* (2013.01); *H01L 27/322* (2013.01); *H01L 27/323* (2013.01)

(58) Field of Classification Search
  CPC ......................................... G06F 3/044
  See application file for complete search history.

(56) References Cited

U.S. PATENT DOCUMENTS

2009/0315854 A1 12/2009 Matsuo
2011/0254804 A1 10/2011 Kuo et al.
(Continued)

FOREIGN PATENT DOCUMENTS

CN  104423674 A  3/2015
CN  104951154 A  9/2015
(Continued)

OTHER PUBLICATIONS

Japanese Office Action, dated Feb. 19, 2019, for Japanese Application No. 2017-248926, 14 pages. (with English Machine Translation).

*Primary Examiner* — Roy P Rabindranath
(74) *Attorney, Agent, or Firm* — Seed IP Law Group LLP

(57) ABSTRACT

Embodiments disclosed herein provide a sensing unit including: a plurality of first electrodes disposed on a substrate; a plurality of second electrodes disposed on the substrate; a plurality of first connection parts, each of which is disposed between two adjacent first electrodes among the plurality of first electrodes so as to connect the plurality of first electrodes in a first direction; and a plurality of second connection parts that are disposed in a layer that is different from that of the plurality of first connection parts, each of the second connection parts being disposed between two adjacent second electrodes among the plurality of second electrodes so as to connect the plurality of second electrodes in a second direction that is different from the first direction.

18 Claims, 14 Drawing Sheets

(56) References Cited

U.S. PATENT DOCUMENTS

| | | | |
|---|---|---|---|
| 2012/0081300 A1* | 4/2012 | Chan | G06F 3/044 345/173 |
| 2014/0111709 A1* | 4/2014 | Kim | G02F 1/13338 349/12 |
| 2014/0313435 A1* | 10/2014 | Cho | H01J 9/20 349/12 |
| 2015/0054803 A1 | 2/2015 | Yashiro et al. | |
| 2015/0277483 A1* | 10/2015 | Lee | G06F 3/044 345/174 |
| 2016/0103516 A1 | 4/2016 | An | |
| 2016/0117031 A1* | 4/2016 | Han | G06F 3/0412 345/174 |
| 2016/0202792 A1 | 7/2016 | Han et al. | |
| 2016/0266691 A1 | 9/2016 | Jang et al. | |

FOREIGN PATENT DOCUMENTS

| | | |
|---|---|---|
| JP | 2010-2958 A | 1/2010 |
| JP | 2014-229136 A | 12/2014 |
| JP | 2015-121829 A | 7/2015 |
| TW | I540484 B | 7/2016 |
| TW | I562113 B | 12/2016 |

\* cited by examiner

SENSING UNIT FOR SENSING TOUCH, DISPLAY INCLUDING SENSING UNIT, AND METHOD FOR MANUFACTURING THE SAME

CROSS REFERENCE TO RELATED APPLICATION

This application claims priority from Korean Patent Application No. 10-2017-0068425, filed on Jun. 1, 2017, which is hereby incorporated by reference in its entirety.

BACKGROUND OF THE DISCLOSURE

1. Technical Field

Disclosure herein relates to a sensing unit that senses a touch, a display device including the sensing unit, and a method of manufacturing the display device.

2. Description of the Prior Art

As the information-oriented society has been developed, requests for various types of display devices for displaying images have increased, and various kinds of display devices, such as a Liquid Crystal Display (LCD), a Plasma Display Panel (PDP), and an Organic Light-Emitting Display (OLED), have been utilized.

In addition, a display device is capable of being operated by receiving a user's command through various input devices, such as a keyboard or a mouse. There has been developed a display device, which senses touch using a touch sensor such that a user's command is intuitively and conveniently input by touching the screen of the display device. The touch sensor is disposed on the screen of the display device, and a user's command can be input by touching a specific point on the screen of the display device.

The touch sensor is formed on the substrate of the display device through a plurality of processes in such a manner that a plurality of electrodes intersect each other, and a touch point can be determined by sensing capacitance formed corresponding to the plurality of electrodes. At this time, the plurality of electrodes should not be in contact with each other at an intersection point. Foreign matter generated while performing various processes may cause contact at an intersection point or breakage of connection of each electrode. Due to such a defect, the display device must be discarded, and as a result, yield is lowered and manufacturing costs are increased.

BRIEF SUMMARY

Embodiments disclosed herein provide a sensing unit that senses a touch, a display device including the sensing unit, and a method of manufacturing the display device, which allow a yield to be improved, so that manufacturing costs can be reduced.

In addition, embodiments disclosed herein provide a sensing unit for sensing a touch, a display device including the sensing unit, and a method of manufacturing the display device, which allow a defect of a touch electrode to be simply repaired.

In one aspect, embodiments disclosed herein provide a sensing unit including: a plurality of first electrodes disposed on a substrate; a plurality of second electrodes disposed on the substrate; a plurality of first connection parts, each of which is disposed between two adjacent first electrodes among the plurality of first electrodes so as to connect the plurality of first electrodes in a first direction. Among the plurality of first connection parts, at least one first connection part includes a first wiring and a second wiring that is disposed at a predetermined distance from the first wiring, and at least one of the first wiring and the second wiring connects the plurality of first electrodes in the first direction.

In another aspect, embodiments disclosed herein provide a display device that includes a display panel including a first substrate and a second substrate over the first substrate, and a sensing unit intergraded into the display panel. The sensing unit includes: a plurality of first electrodes disposed over the second substrate; a first connection part disposed between two adjacent first electrodes among the plurality of first electrodes and the first connection part including a first wiring and a second wiring separate one another, and at least one of the first wiring and the second wiring connecting the two adjacent electrodes in the one direction, each through a via.

In another aspect, embodiments disclosed herein provide a method of manufacturing a display device. The method includes: forming a first metal layer on a substrate and forming a plurality of first connection parts by patterning the first metal layer in such a manner that, among the plurality of first connection parts, at least one first connection part includes a first wiring and a second wiring and the first wiring and the second wiring are formed to have a predetermined distance therebetween; forming a plurality of first electrodes and a plurality of second electrodes by depositing an insulating film on the substrate on which the first connection part is formed and then forming and patterning a second metal layer, wherein, among the plurality of first electrodes, two adjacent first electrodes are connected to the first wiring; and inspecting a connection between two adjacent first electrodes and the one first connection part.

In another aspect, embodiments disclosed herein provide a display device that includes a display panel including a substrate, and a sensing unit mounted on the display panel. The sensing unit includes: a plurality of first electrodes disposed on the substrate, and a plurality of first connection parts disposed over the substrate; a first connection part disposed between adjacent first electrodes among the plurality of first electrodes and the first connection part including a first wiring and a second wiring separate from one another, at least one pair of the adjacent firsts electrode being connection through at least one of the first wiring or the second wiring and at least one of the first wiring or the second wiring and at least another pair of the adjacent first electrodes being connected only through the second wiring.

According to embodiments disclosed herein, it is possible to provide a sensing unit that senses a touch, a display including the sensing unit, and a method of manufacturing the display device, which allow a yield to be improved, so that manufacturing costs can be reduced.

According to embodiments disclosed herein, it is possible to provide a sensing unit for sensing a touch, a display including the sensing unit, and a method of manufacturing the same, which allow a defect of a touch electrode to be simply repaired.

BRIEF DESCRIPTION OF THE SEVERAL VIEWS OF THE DRAWINGS

The above and other objects, features and advantages of the present disclosure will be more apparent from the following detailed description taken in conjunction with the accompanying drawings, in which.

DETAILED DESCRIPTION

Figure 1:
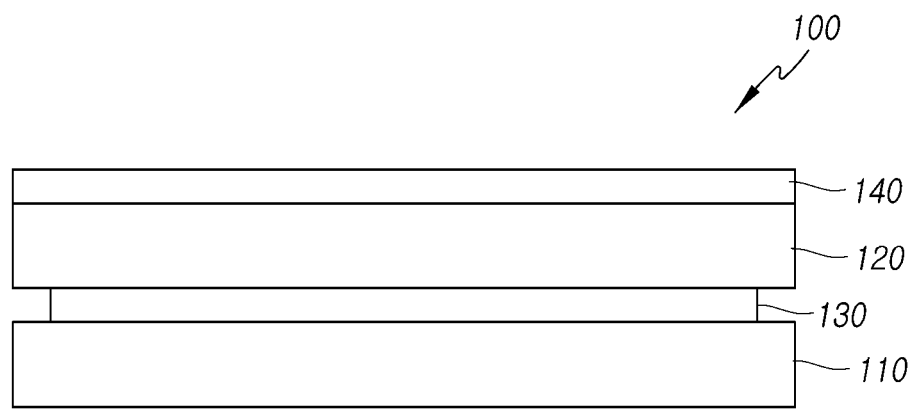
FIG. 1 is a cross-sectional view illustrating an embodiment of a display device according to the disclosure.

Hereinafter, some embodiments of the disclosure will be described in detail with reference to the accompanying illustrative drawings. In designating elements of the drawings by reference numerals, the same elements will be designated by the same reference numerals although they are shown in different drawings. Further, in the following description of the present disclosure, a detailed description of known functions and configurations incorporated herein will be omitted when it may make the subject matter of the present disclosure rather unclear.

In addition, terms, such as first, second, A, B, (a), (b) or the like may be used herein when describing components of the disclosure. Each of these terminologies is not used to define an essence, order or sequence of a corresponding component but used merely to distinguish the corresponding component from other component(s). In the case that it is described that a certain structural element "is connected to", "is coupled to", or "is in contact with" another structural element, it should be interpreted that another structural element may "be connected to", "be coupled to", or "be in contact with" the structural elements as well as that the certain structural element is directly connected to or is in direct contact with another structural element.

FIG. 1 is a cross-sectional view illustrating an embodiment of a display device according to the disclosure.

Referring to FIG. 1, a display device 100 includes a first substrate 110, an organic film 130 that is deposited over the first substrate 110 to emit light, and a second substrate 120 that protects the organic film 130 deposited on the first substrate 110. In addition, a sensing unit 140 may be disposed over the second substrate 120. The second substrate 120 is bonded to the first substrate 110 by a sealing material (not illustrated) to seal the organic film 130, and thus the second substrate 120 may be referred to as a sealing substrate.

The first substrate 110 may include a plurality of pixel circuits (not illustrated) and the organic film 130 may be connected to the pixel circuits. Each pixel circuit may be formed with elements, such as a plurality of transistors (not illustrated) and a capacitor (not illustrated), and may selectively transfer an electric current to the organic film 130 so that light can be emitted from the organic film 130. However, without being limited thereto, a plurality of pixel circuits may be formed over the first substrate 110. In addition, the first substrate 110 may be made of an insulating material or a metallic material. The organic film 130 may be formed to correspond to a light-emitting region that emits light.

The second substrate 120 may be opposed and bonded to the first substrate 110 so as to protect the organic film 130 from moisture and/or foreign matter. The thickness of the second substrate 120 may be 5 µm or more, and may be made of an insulating material. The sensing unit 140, which senses a touch position, may be disposed over the second substrate 120.

Here, the sensing unit 140 may include a separate touch panel (not separately shown) formed over the second substrate that is distinguished from a separate display device. In addition, the sensing unit 140 may include a touch electrode(s) formed over the second substrate 120. That is, the sensing unit 140 includes not only a separate touch panel formed over the second substrate 120 so as to sense a touch, but also a touch electrode(s) formed over the second substrate 120 and mounted on, e.g., the Organic Light-Emitting Diode (OLED) display device 100. Therefore, it is possible to implement the OLED display device 100 to have a reduced thickness. However, the position of the touch electrode is not limited thereto. It should be appreciated that although the sensing unit 140 is shown as a separate element than the second substrate 120, the disclosure is not limited by this illustrative example, and the sensing unit 140 and the second substrate 120 may be at least partially integrated with one another and the sensing unit 140 including the touch panel may be together integrated into/embedded in the display device 100. In the disclosure herein, the second substrate 120 may also be described as part of the sensing unit 140.

The organic film 130 may receive a driving current from each pixel circuit so as to emit light. The organic film 130 may be formed independently for each pixel. Then, a plurality of light-emitting regions, in which light is emitted by the organic film, may be disposed over the first substrate 110. In addition, the organic film 130 may be a plurality of organic compound layers of an organic light-emitting diode. The organic-light emitting diode includes an anode electrode, a cathode electrode, and an organic compound layer formed therebetween. The organic compound layer may include a Hole Injection Layer (HIL), a Hole Transport Layer (HTL), an Emission Layer (EML), an Electron Transport Layer (ETL), and an Electron Injection Layer (EIL). When a driving voltage is applied to the anode electrode and the cathode electrode by the operation of the pixel circuit, holes, which have passed through the HTL, and the electrons, which have passed through the ETL, move to the EML thereby forming excitons and thus generating visible light in the EML.

Here, the display device is illustrated as an OLED display device, but may be, but not exclusively, a liquid crystal display device or a Plasma Display Panel (PDP), none of which limits the scope of the disclosure.

Figure 2:
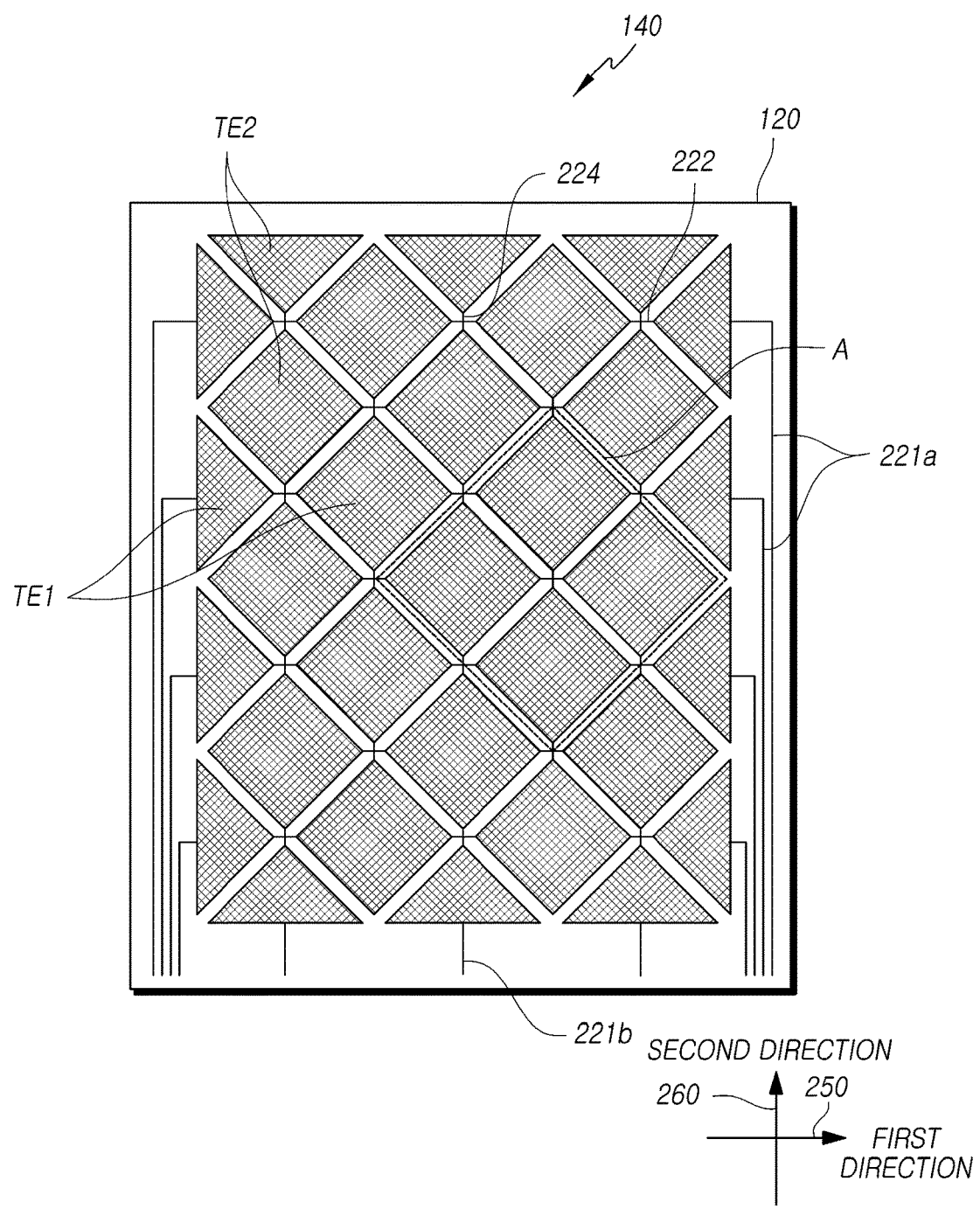
FIG. 2 is a plan view illustrating an embodiment of a sensing unit employed in the display device illustrated in FIG. 1.

FIG. 2 is a plan view illustrating an embodiment of a sensing unit 140 included in the display device 100 illustrated in FIG. 1.

Referring to FIG. 2, the sensing unit 140 may include a second substrate 120 and a plurality of electrodes TE1 and TE2. The plurality of electrodes TE1 and TE2 may include a touch-driving electrode(s), e.g., TE1, that receives a touch-driving signal and a touch-sensing electrode(s), e.g., TE2, that corresponds to the touch-driving signal. The plurality of electrodes TE1 and TE2 may include a plurality of first electrodes TE1 that are connected in the row/first direction 250 by first connection parts 222 so as to form a plurality of electrode rows, and a plurality of second electrodes TE2 that are connected in the column/second direction 260 by second connection parts 224 so as to form a plurality of electrode columns. Although the plurality of electrodes TE1, TE2 are illustrated as arranged in a 4×3 row/column form here, the present disclosure is not limited thereto.

The first electrodes TE1 may receive a touch-driving signal, and the second electrodes TE2 may transmit a touch-sensing signal that corresponds to the touch-driving signal. The first electrodes TE1 and the second electrodes TE2 may be formed over the same layer on the second substrate 220. However, the present disclosure is not limited thereto.

Each first connection part 222 may connect one first electrode TE1 to another adjacent first electrode(s) TE1, and each second connection part 224 may connect one second electrode TE2 to another adjacent second electrodes TE2. The first connection parts 222 and second connection parts 224 may intersect one another. In order to ensure that the first electrodes TE1 and the second electrodes TE2 are not directly connected to each other, the first connection parts 222 that connect the first electrodes TE1 to one another may be formed in a layer that is different from a layer where the first electrodes TE1 and the second electrodes TE2 are formed, and the first electrodes TE1 and the first connection parts 222 may be connected to one another through vias (not illustrated in FIG. 2). The second connection parts 224 that connect the second electrodes TE2 to one another may be formed in a layer that is the same as a layer where the first electrodes TE1 and the second electrodes TE2 are formed, so that the second electrodes TE2 can be connected in the same layer.

It should be appreciated that in FIG. 2, the first connection parts 222 and the second connection parts 224 are not necessarily shown with their proportional relationship in size to the first and second electrodes TE1, TE2, and first connection parts 222 and/or second connection parts 224 may include much larger breadth as compared to the first and second electrodes TE1, TE2 than those illustrated in FIG. 2.

In addition, the first electrodes TE1 and the second electrodes TE2 may be formed by patterning a conductive metallic layer. The first electrodes TE1 and the second electrodes TE2 may be formed of a transparent material, such as Indium Tin Oxide (ITO). In addition, the patterned first electrodes TE1 and second electrodes TE2 may include an electrode pattern(s) formed in the form of a mesh, and the first electrodes TE1 and the second electrodes TE2 may have a plurality of openings. Light, which is emitted from the display device through the first electrodes TE1 and the second electrodes TE2 made of the ITO electrodes or the plurality of openings included in the first electrodes TE1 and the second electrodes TE2, may be transmitted through the first electrodes TE1 and the second electrodes TE2, or may be emitted to the outside through the plurality of openings.

The patterns of the first electrodes TE1 and the second electrodes TE2, e.g., formed in the form of a mesh, may be referred to as touch electrode wirings. In addition, the first electrodes TE1 and the second electrodes TE2 may be connected to driving lines 221a that cause a driving signal, which drives the first electrodes TE1 and second electrodes TE2, to be applied to a touch electrode, and sensing lines 221b that cause a sensing signal, which is generated to correspond to the touch sensed by the touch electrode, to be transmitted. The driving lines 221a and the sensing lines 221b may be referred to as touch wirings.

Figure 3:
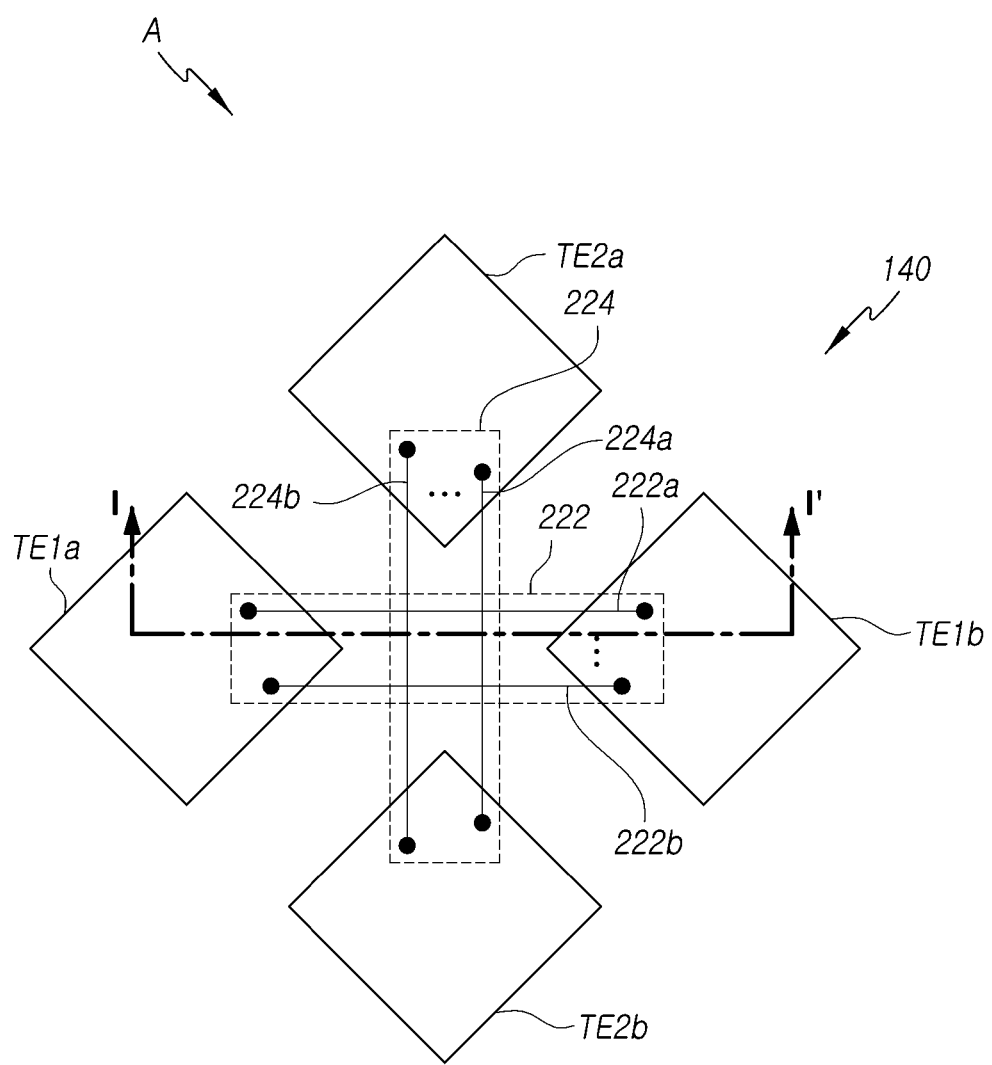
FIG. 3 is a plan view illustrating a second embodiment of the display device according to the disclosure.

FIG. 3 is a plan view illustrating an enlarged view of portion "A" of the sensing unit 140 of FIG. 2 according to the present disclosure.

Referring to FIG. 3, the sensing unit 140 may include: a plurality of first electrodes TE1 (two shown, TE1a, TE1b) disposed over a substrate (not illustrated for simplicity); a plurality of second electrodes TE2 (two shown, TE2a, TE2b) disposed over the substrate; a plurality of first connection parts 222, each of which is disposed between two adjacent first electrodes TE1a and TE1b among the plurality of first electrodes TE1 so as to connect the plurality of first electrodes TE1 in a first direction 250; and a plurality of second connection parts 224 that are disposed in a layer that is different from the layer of the plurality of first connection parts 222, each of the second connection parts 224 being disposed between two adjacent second electrodes TE2 (TE2a and TE2b) so as to connect the second electrodes TE2 in a second direction 260 that is different from the first direction 250. The plurality of first connection parts 222 and the plurality of second connection parts 224 may intersect one another, but are disposed over different layers so as not to be physically connected. Therefore, since the first electrodes TE1 (TE1a, TE1b) and the second electrodes TE2 (TE2a, TE2b) are not physically connected to each other, capacitive coupling is generated between the first electrodes TE1 (TE1a, TE1b) and the second electrodes TE2 (TE2a, TE2b), and the sensing unit 140 can recognize a touch by sensing a change in the capacitance of the capacitive coupling.

In addition, in the sensing unit 140, among the plurality of first connection parts 222, at least one first connection part 222 may include at least one first wiring 222a, and at least one second wiring 222b that is disposed at a predetermined distance from the first wiring 222a. That is, the first wiring 222a and the second wiring 222b are separate from one another. Accordingly, even if the first wiring 222a of the first connection part 222 is cut off in the process of forming the plurality of electrodes TE1, TE2, the plurality of first electrodes TE1 (TE1a and TE1b) are still connected by the second wiring 222b, so that the first electrodes TE1 (TE1a and TE1b) may be connected in the first direction 250 through at least one of the first wiring 222a or the second wiring 222b. At this time, the first wiring 222a and the second wiring 222b may not need to be made to connect between the adjacent first electrodes TE1a and TE1b at the same time, and when it is determined, e.g., through an inspection process, that a defect has occurred between the first electrodes TE1a and TE1b after only one of the first wiring 222a or the second wiring 222b is caused to connect between the first electrodes TE1a and TE1b, the first electrodes TE1a and TE1b may be caused to be connected to one another through the other one of the first wiring 222a or the second wiring 222b, which initially has been designed not to connect between the first electrodes TE1a and TE1b, to connect between the first electrodes TE1a and TE1b.

In addition, among the plurality of second connection parts 224, at least one second connection part 224 may include a first wiring 224a and a second wiring 224b disposed at a predetermined distance from the first wiring 224a. Then, one of the first wiring 224a and the second wiring 224b is connected so that the second electrodes TE2a and TE2b are connected to each other in the second direction 260, and then an inspection of the connection is performed. When it is determined that the second electrodes TE2a and TE2b are not connected to one another in the second direction 260 as a result of the inspection, the second electrodes TE2a and TE2b may be made to be connected to one another in the second direction 260 using the other one of the first wiring 224a or the second wiring 224b.

Here, the first electrodes TE1a and TE1b and the second electrodes TE2a and TE2b are illustrated as having a diamond shape for illustrative purposes only, but the present disclosure is not limited thereto.

Figure 4:
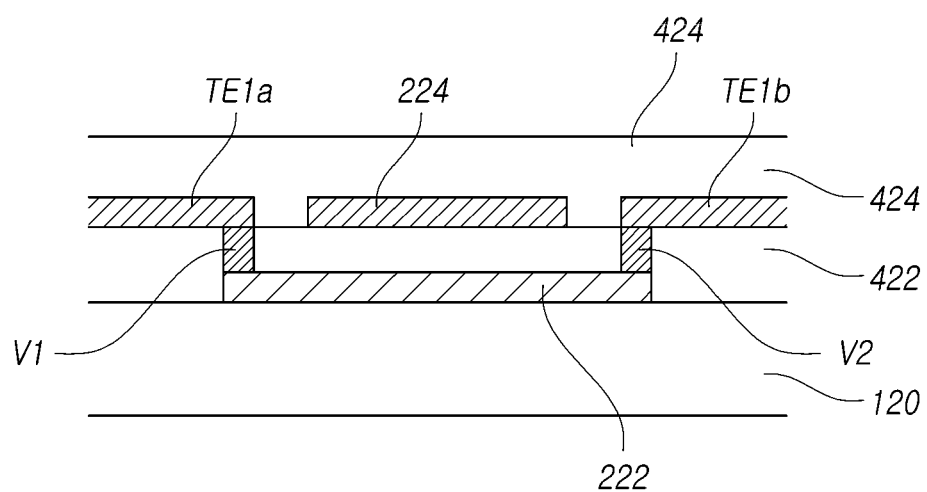
FIG. 4 is a cross-sectional view illustrating a cross section of the sensing unit illustrated in FIG. 3.

FIG. 4 is a cross-sectional view illustrating a cross section of the sensing unit 140 of FIG. 3 through a cutting-plane line I-I'.

Referring to FIG. 4, in the sensing unit 140, a first connection part 222 is formed by forming and patterning a first metal layer on a substrate 120. At this time, the first connection part 222 may include a first wiring and a second wiring as illustrated in FIG. 3. Here, the substrate 120 may be the second substrate 120 illustrated in FIG. 1. However, the present disclosure is not limited thereto.

In addition, a first insulating film 422 may be formed over the substrate 120, over which the first connection part 222 is disposed, and via holes may be formed at predetermined positions. In addition, a plurality of electrodes may be formed by patterning a second metal layer over the first insulating film 422 formed over the substrate 120. The plurality of electrodes may include first electrodes TE1 (TE1a, TE1b) and second electrodes TE2 (not shown in FIG. 4), and vias V1 and V2 are formed through the via holes, so that the adjacent first electrodes TE1a, TE1b can be connected through the first connection part 222 through respective vias V1, V2. At this time, the second electrodes TE2 may be connected through the second connection part 224. Then, a second insulating film 424 can be formed thereover. When the sensing unit 140 is formed over the substrate 120 as described above, the second metal layer may be patterned to form a plurality of electrodes, and then a post-inspection process may be performed so as to determine whether a defect has occurred in the sensing unit 140. The defect may be that one or more of the adjacent first electrodes TE1a, TE1a are not connected to the first connection part 222 since a via (V1, V2) is not properly formed due to unexpected foreign matter or the like that is generated in the subsequent processes after the first connection part 222 is formed. Also, the defect may be that the second electrodes TE2 are connected to the first connection part 222 through an unexpected foreign matter.

When it is determined that a defect has occurred, repair may be performed using the second wiring 222b (not separately shown in FIG. 4) of the first connection part 222. After the repair has been carried out, inspection may be performed again. Therefore, since the repair may be simply performed through the second wiring 222b of the first connection part 222, the yield of the sensing unit 100 can be increased, thereby reducing manufacturing costs.

Figure 5:
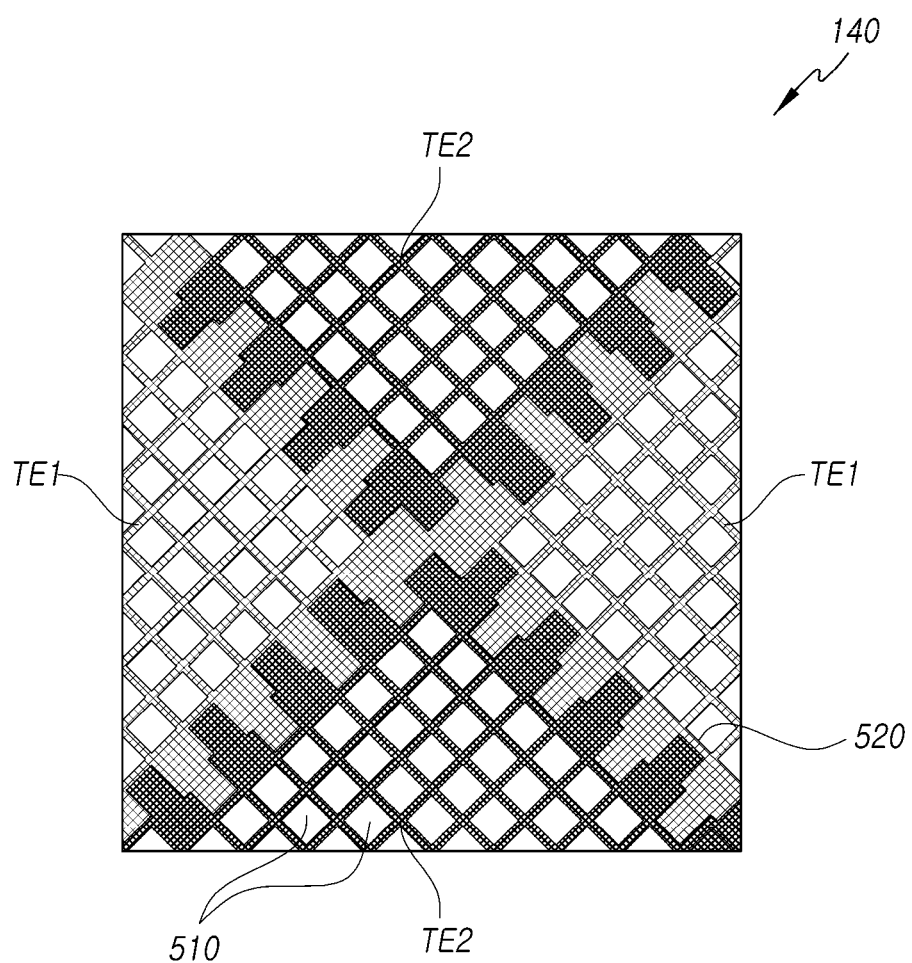
FIG. 5 is a plan view illustrating a third embodiment of the sensing unit according to the disclosure.

FIG. 5 is a plan view showing a first embodiment of the sensing unit 140 including first electrodes and second electrodes among the touch electrodes illustrated in FIG. 2.

Referring to FIG. 5, the sensing unit 140 may have first electrodes TE1 arranged in the horizontal/first direction 250 and second electrodes TE2 arranged in the vertical/second direction 260. In addition, two first electrodes TE1, which are arranged in the horizontal direction 250, and two second electrodes TE2, which are arranged in the vertical direction 260 and intersect the two first electrodes TE1, may be determined to be one individual sensing sub-unit SU. In the first electrodes TE1 and the second electrodes TE2, a plurality of electrode patterns intersects one another such that openings (not illustrated) may be included therein.

In addition, each of the first electrode TE1 and the second electrode TE2 may include a plurality of floating patterns 510. Here, the portions where the floating patterns 510 are formed are illustrated as blank, but this is merely for the purposes of illustration, and the portions illustrated as blanks also intersect the electrode patterns. The floating patterns 510 may be cut-off portions among the electrode patterns that are disposed in a region of the first electrodes TE1 or the second electrodes TE2 in an intersecting form. In addition, the first electrodes TE1 and the second electrodes TE2 may be in the form of being engaged with one another in a region where the first electrodes TE1 and the second electrodes TE2 are adjacent to one another. Further, although the first electrodes TE1 and the second electrodes TE2 are illustrated as abutting on one another in the drawing, the first electrodes TE1 and the second electrodes TE2 may be spaced apart from one another by a distance, which is not indicated in the drawing. As a result, the first electrodes TE1 and the second electrodes TE2 do not contact one another, so that capacitive coupling can be formed therebetween. The surfaces where the first electrodes TE1 and the second electrodes TE2 are adjacent to one another may be formed to be larger, whereby capacitance between the first electrodes TE1 and the second electrodes TE2 may be implemented to be higher. Also, although the second electrodes TE2, which are different from each other, extend to be connected to one another through the second connection parts on a same layer as the second electrodes TE2, the first electrodes TE1, which are different from one another, may be connected with one another through first connection parts, which are disposed in a different lower layer.

Figure 6:
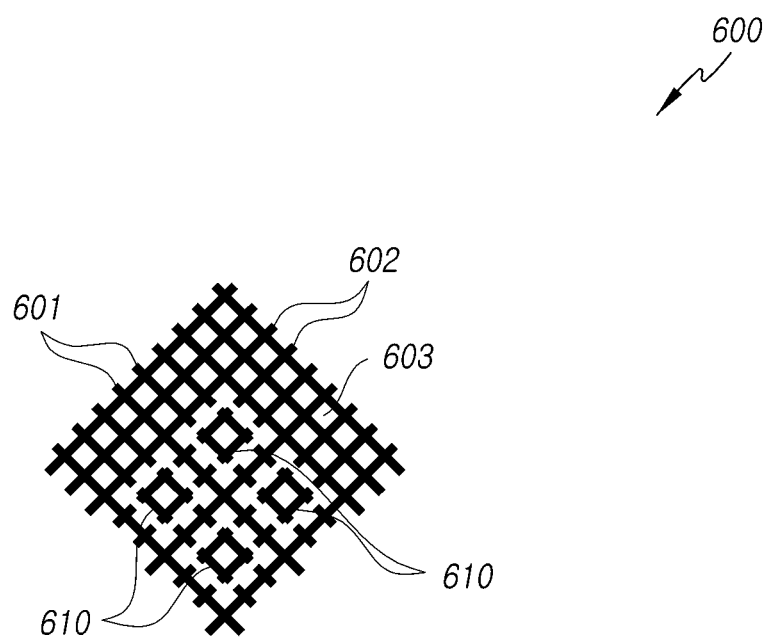
FIG. 6 is a conceptual view for describing an electrode pattern and a floating pattern in the sensing unit illustrated in FIG. 5.

FIG. 6 is a conceptual view for describing an electrode region and a floating electrode region in the sensing sub-unit SU illustrated in FIG. 5.

Referring to FIG. 6, an electrode 600 may be formed by/include a plurality of electrode regions 601 and 602, which intersect one another. The electrode regions 601 and 602 may be made to surround/define openings 603. Accordingly, the electrode regions 601 and 602 may include a mesh pattern. In addition, the light emitted from the display device 100 can be transmitted to the outside through, among others, the openings 603. In addition, the electrode 600 may include floating electrode regions 610 that intersect one another and are cut off from the other electrode regions 601, 602 at a plurality of cut-off points. The floating electrode regions 610 may be in a floating state since the floating electrode regions 610 are not connected to the electrode regions 601 and 602.

The electrode 600 may be capacitively coupled with a cathode electrode (not illustrated) or the like, which is disposed under the sensing unit 140 in the display device 100. Upon being capacitively coupled with a cathode electrode, the voltage of the cathode electrode may fluctuate due to a signal flowing in the electrode 600, or a signal flowing in the electrode 600 may be distorted due to the change of the voltage of the cathode electrode. However, when the electrode 600 includes the floating electrode regions 610, since the floating electrode pattern 610 does not have the voltage applied thereto, the area of the electrode 600 that capacitively corresponds to the cathode electrode may be reduced by the floating electrode regions 610. As a result, the capacitive coupling between the electrode 600 and the cathode electrode is very small, so that it is possible to suppress the occurrence of a touch malfunction or a display device malfunction.

Figure 7:
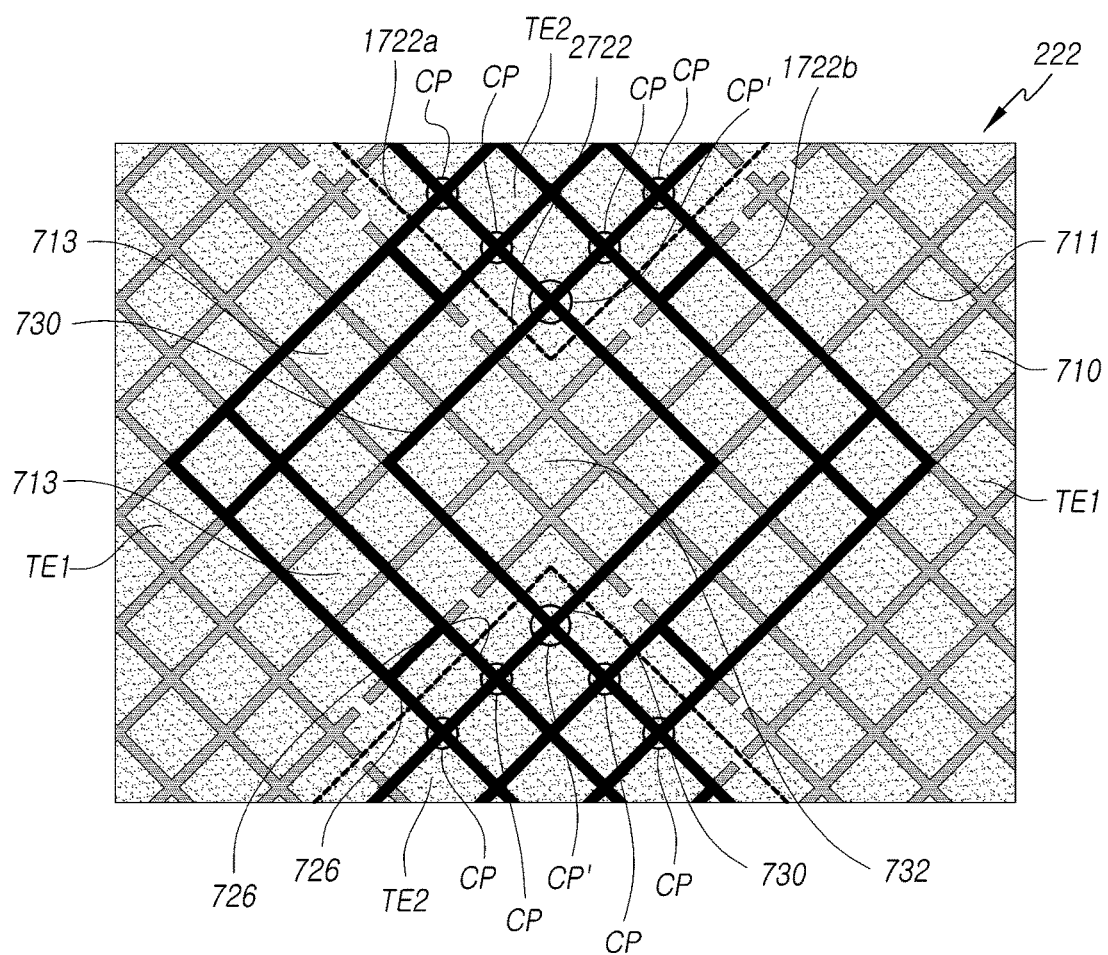
FIG. 7 is a plan view illustrating a first embodiment of a first connection part employed in the sensing unit illustrated in FIG. 5.

FIG. 7 is a plan view illustrating a first embodiment of an electrode employed in the sensing unit illustrated in FIG. 5.

Referring to FIG. 7, first electrode TE1 (shown portion) may include electrode regions 711 and openings 710 defined by the electrode regions 711. Connection patterns 1722a, 1722b, and 2722 of a first connection part (not illustrated), each formed by patterning a metal layer, may be disposed in association with first electrode TE1. Here, it is illustrated that the connection patterns 1722a, 1722b, and 2722 are formed over a layer that is different from that of the first electrode TE1 with electrode regions 711, and at least partially overlap the electrode regions 711 on one projection plane, but this embodiment is not limited thereto. The portions where the connection patterns 1722a, 1722b, and 2722 overlap the electrode patterns 711 are indicated by a dark color, and the portions where only the electrode regions 711 are formed are indicated by a light color. Also, one or more of the connection patterns 1722a, 1722b, and 2722 and the electrode regions 711 (and thus first electrode TE1) may be connected to one another at some points through a via(s) (not illustrated). Connection patterns 1722a, 1722b (or generally 1722) may include multiple intersecting metal regions 726 and multiple openings 713 defined by the multiple intersecting metal regions 726. Openings 713 in connection patterns 1722a, 1722b may overlap in projection with one or more openings 710 in first electrode TE1. Connection pattern 2722 may include multiple intersecting metal regions 730 and an opening 732 defined by the multiple intersecting metal regions 730. Opening 732 in connection pattern 2722 may overlap in projection with one or more (illustrated as nine) openings 710 in first electrode TE1.

The connection patterns 1722 (1722a, 1722b), and 2722 and the openings 713, 732 formed by the connection patterns 1722a, 1722b, and 2722 may be part of the first connection parts 222 illustrated in FIGS. 2-4. For example, the connection patterns 1722a, 1722b may be part of the first wiring 222a of FIG. 3, and connection pattern 2722 may be part of the second wiring 222b of FIG. 3. In the description herein, connection patterns 1722 (1722a, 1722b) may be referred to as first connection pattern 1722 and/or first wiring 1722 as contexts apply and connection pattern 2722 may be referred to as second connection pattern 2722 and/or second wiring 2722 as contexts apply, which should not limit or vary the scope of the disclosure.

In an example, the first connection patterns/wiring(s) 1722a and 1722b each may include at least two parallel metal regions 726 (first and second metal regions 726) and at least another (third) metal region 726 that intersects the two parallel metal regions 726. In an example, a fourth metal region 726 disposed in parallel to the third metal region 726 intersects both the first and second metal regions 726. The third and fourth metal regions 726 may extend beyond at least one of the first and second metal regions 726 such that first connection pattern 1722 includes an L shape in a projection plane.

In an example, first connections patterns 1722a, 1722b are positioned beyond an outer periphery of second connection pattern 2722.

In an non-limiting example, the second wiring 2722 may have at least one connection pattern disposed inside the first wirings 1722a and 1722b and may have one or more L shaped metal regions 730 and/or a rectangular/square shaped metal region 730. Metal region(s) 730 overlap in projection at least a portion (or partially) of some of the electrode regions 711 of first electrode TE1. However, the present invention is not limited thereto. Although the first wirings 1722a and 1722b and the second wirings 2722 are illustrated as not being connected to one another, the separate first wirings 1722a and 1722b and the second wirings 2722 may be connected to one another at some point.

The connection patterns 1722, 2722 overlap some electrode regions 710 and thus the openings 710 formed by electrode regions 711 are not (or at least not fully) covered/blocked by the connection patterns 1722a, 1722b, and 2722, so that it is possible to prevent the aperture ratio of the display device 100 from being decreased by the connection patterns 1722a, 1722b, and 2722. In addition, since the first wirings/connection patterns 1722a and 1722b, and second wirings/connection patterns 2722 may each include at least two parallel metal regions 726, 730 and at least another metal region that intersects the two parallel metal regions, the magnitude of the capacitance between the region where the first wirings 1722a and 1722b are formed among the connection patterns and the electrode regions 710 of first electrode TE1 can be more uniformly maintained, and as a result, the touch sensitivity can be maintained.

In addition, although the example first connection patterns for the first wirings 1722a and 1722b are illustrated as being divided into two separate portions on the left and right sides, the first connection patterns 1722 may be connected to one another, without being limited thereto.

Figure 8:
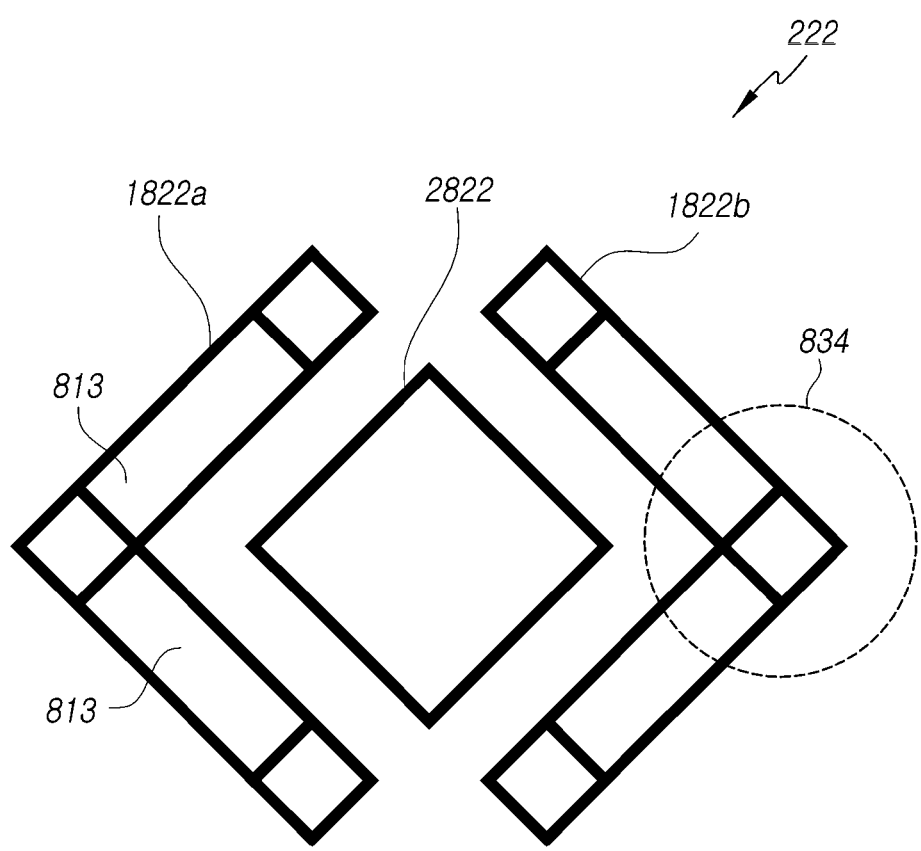
FIG. 8 is a plan view illustrating a second embodiment of the first connection part employed in the sensing unit illustrated in FIG. 5.
Figure 9:
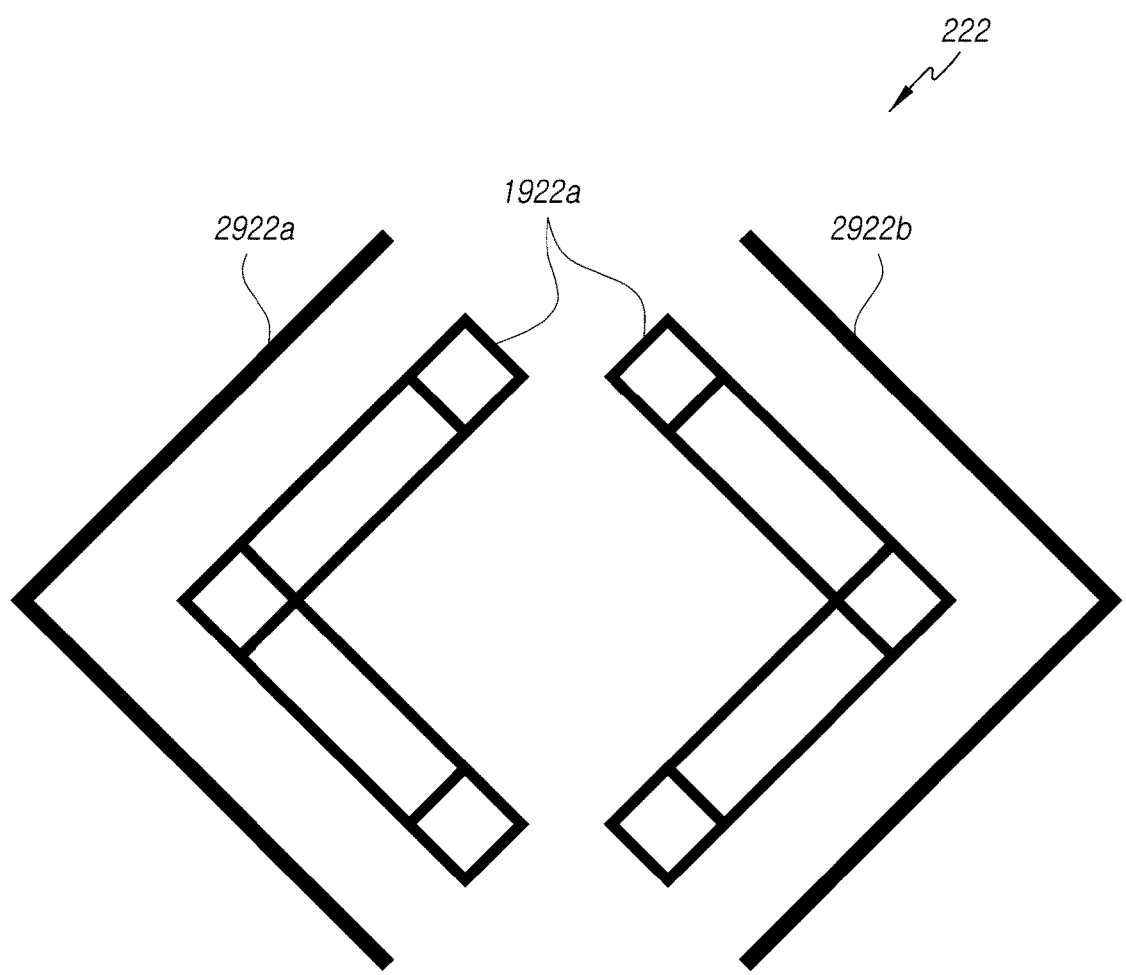
FIG. 9 is a plan view illustrating a third embodiment of the first connection part employed in the sensing unit illustrated in FIG. 5.

FIG. 8 is a plan view illustrating a second embodiment of the first connection part employed in the sensing unit illustrated in FIG. 5. FIG. 9 is a plan view illustrating a third embodiment of the first connection part employed in the sensing unit illustrated in FIG. 5.

Referring to FIG. 8, first wirings 1822a and 1822b may be disposed on the outer periphery of the first connection part 222, and a second wiring 2822 may be disposed within the first wirings 1822a and 1822b. That is, first wiring(s) 1822a, 1822b are disposed beyond an outer periphery of the second wiring 2822. In the first wirings 1822a and 1822b, a plurality of wirings/metal regions 826, e.g., formed by patterning a metal layer, intersect one another so that a plurality of openings 813 are formed, and first wirings 1822 may include an bent/elbow portion(s) 834 may exist in, e.g., the centers of the first wirings 1822a and 1822b. It is illustrated that the first wirings 1822a and 1822b are patterned to be divided into two portions of a left wiring 1822a and a right wiring 1822b. However, without being limited thereto, the first wirings 1822a and 1822b may be connected to one another to be recognized as one pattern.

In addition, it is illustrated that the second wiring 2822 disposed inside the first wirings 1822a and 1822b is not patterned and include four intersecting wiring regions 830 defining a single opening 832, and as a result, no other opening is separately formed. However, the present disclosure is not limited thereto.

In addition, it is illustrated that the first wirings 1822*a* and 1822*b* and the second wiring 2822 are not connected to one another. However, without being limited thereto, the first wirings 1822*a* and 1822*b* and the second wiring 2822 may be connected to one another. In addition, the first wirings 1822*a* and 1822*b* may be formed beyond the outer periphery of the second wiring 2822 so that the length of the first wirings 1822*a* and 1822*b* may be longer than the length of the second wiring 2822.

Referring to FIG. 9, in the first connection part 222, second wirings 2922*a* and 2922*b* may be disposed on the outer periphery of the first connection part 222, and the first wirings 1922*a* may be disposed inside the second wirings 2922*a* and 2922*b*. In the first wirings 1922*a*, a plurality of wirings/metal regions may be formed by patterning a metal layer and may intersect one another so that a plurality of openings are formed, and may include bent/elbow portions that may exist, e.g., in the centers of the first wirings 1922*a*.

It is illustrated that the first wirings 1922*a* and the second wirings 2922*a* and 2922*b* are each individually patterned to be divided into two portions of left wirings 1922*a* and 2922*a* and right wirings 1922*a* and 2922*b*. However, without being limited thereto, the first wirings 1922*a* and the second wirings 2922*a* and 2922*b* may be connected to one another to be recognized as one pattern. In addition, it is illustrated that the second wirings 2922*a* and 2922*b* disposed outside the first wirings 1922*a* are not patterned, and as a result, no opening is separately formed. However, the present invention is not limited thereto. In addition, the first wirings 1922*a* and 1922*b* are formed inside the second wirings 2922*a* and 2922*b* so that the length of the first wirings 1922*a* and 1922*b* may be shorter than the length of the second wirings 2922*a* and 2922*b*.

Figure 10:
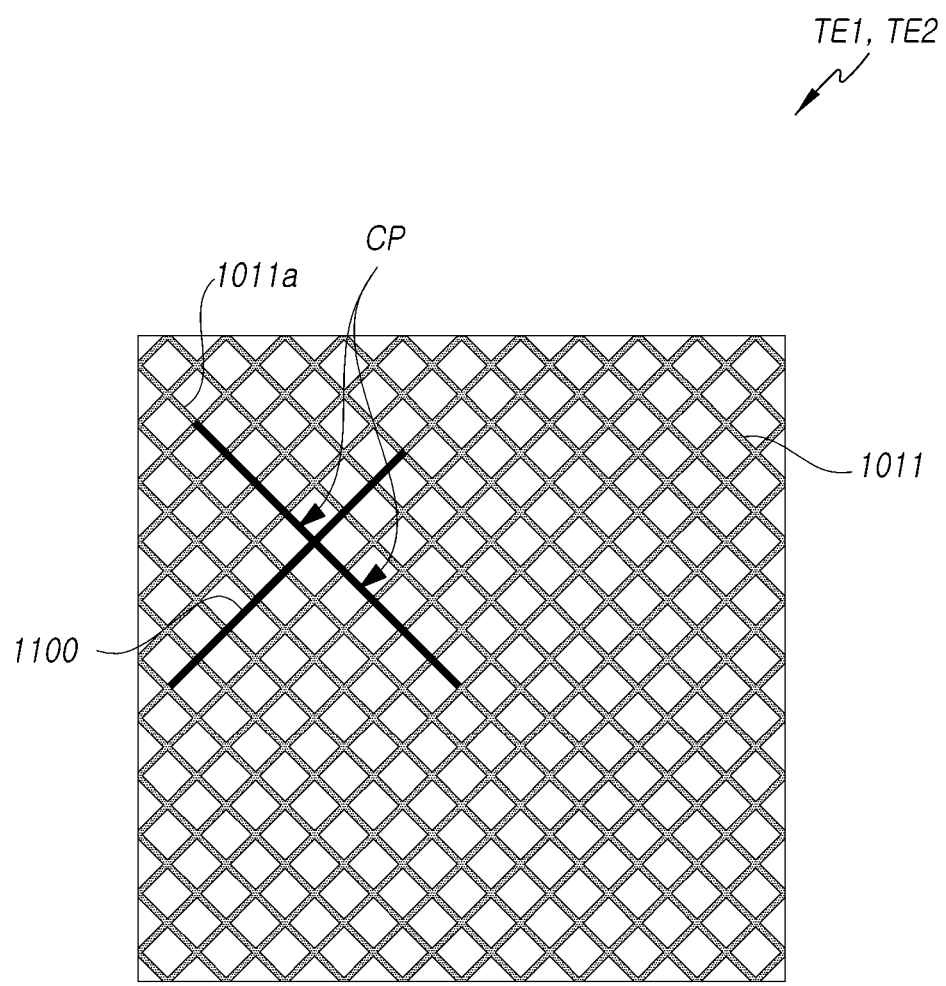
FIG. 10 is a plan view illustrating a third connection part and an electrode pattern employed in the sensing unit illustrated in FIG. 5.

FIG. 10 is a plan view illustrating a third connection part and an electrode pattern employed in the sensing unit illustrated in FIG. 5.

Referring to FIG. 10, an electrode TE1, TE2 may have a plurality of electrode regions 1011 which intersect and are electrically connected to one another. However, when one or more of the electrode regions 1011 is cut off, there is a problem in that the capacitance between the first electrode TE1 and the second electrode TE2 (See, e.g., FIG. 2) becomes smaller. In this case, the cut-off electrode region 1011*a* with two cut-off points CP may be connected using the third connection part 1100. For example, the third connection part 1100 may connect two decoupled portions of the cut-off electrode region 1011*a*.

Figure 11:
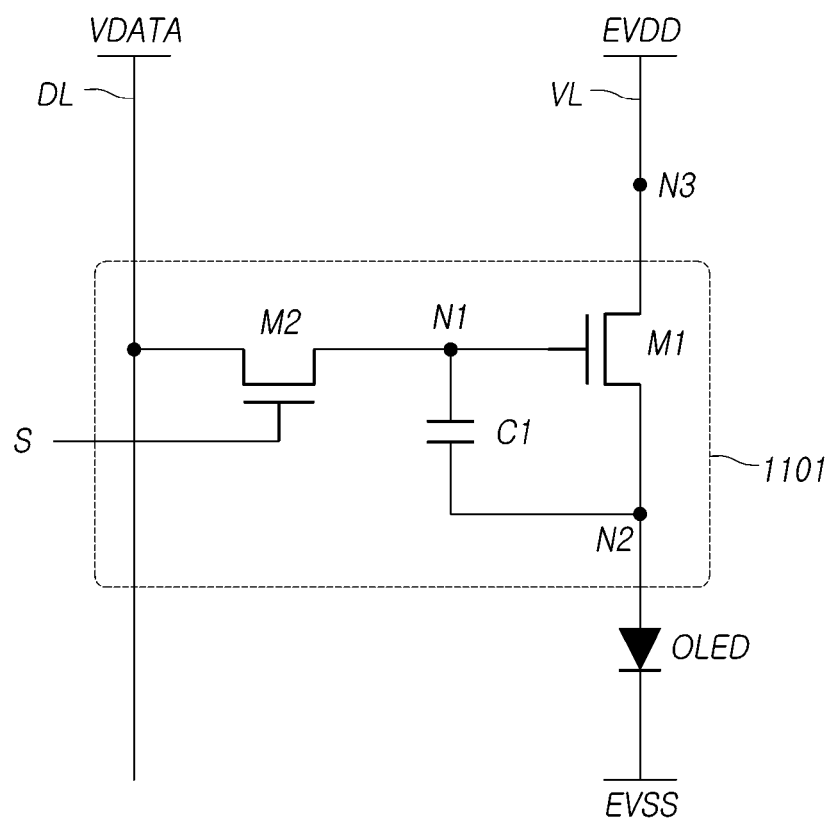
FIG. 11 is a circuit diagram illustrating a pixel structure employed in the organic light-emitting display device illustrated in FIG. 1.

FIG. 11 is a circuit diagram illustrating a pixel structure employed in the organic light-emitting display device illustrated in FIG. 1.

Referring to FIG. 11, a pixel may include an Organic Light-Emitting Diode (OLED) and a pixel circuit. The pixel circuit 1101 may include first and second transistors M1 and M2 and a capacitor C1, and may control a current flowing in the OLED. Here, the first transistor M1 may be a driving transistor that drives a current flowing in the OLED. In addition, a low-potential voltage EVSS applied to the cathode electrode of the OLED may be grounded. However, the present disclosure is not limited thereto.

A first electrode of the first transistor M1 may be connected to a high-potential voltage line VL, to which a high-potential voltage EVDD is applied, a second electrode of the first transistor M1 may be connected to the anode electrode of the OLED, and the gate electrode may be connected to a first node N1. In addition, the first transistor M1 may cause the current to be driven from the first electrode to the second electrode according to a voltage difference between the first electrode and the gate electrode.

The first electrode of the second transistor M2 may be connected to a data line DL, to which a data voltage VDATA corresponding to a data signal is applied, the second electrode may be connected to the first node N1, and the gate electrode may be connected to a gate line S. The second transistor M2 may transmit a data voltage Vdata, which corresponds to a data signal, which is transmitted through a data line DL, to the first node N1, in response to the voltage of a gate signal, which is transmitted through the gate line S.

The capacitor C1 may be connected between the first node N1 and the second node N2 and may maintain the voltage between the first node N1 and the second node N2 so as to allow the voltage, which is applied to the gate electrode of the first transistor M1, to be maintained. When the low-potential voltage EVSS applied to the cathode electrode of the OLED fluctuates, the voltage difference between the first node N1 and the second node N2 is not maintained constant, and as a result, a change may occur in the amount of current flowing in the OLED.

In each of the first transistor M1 and the second transistor M2, a first electrode may be a drain electrode, and a second electrode may be a source electrode. However, the present disclosure is not limited thereto. In addition, although each of the transistors is illustrated as being an NMOS transistor, the transistors may be PMOS transistors without being limited thereto. Further, the pixel circuit illustrated here is merely an illustrative example, and the present disclosure is not limited thereto.

Figure 12:
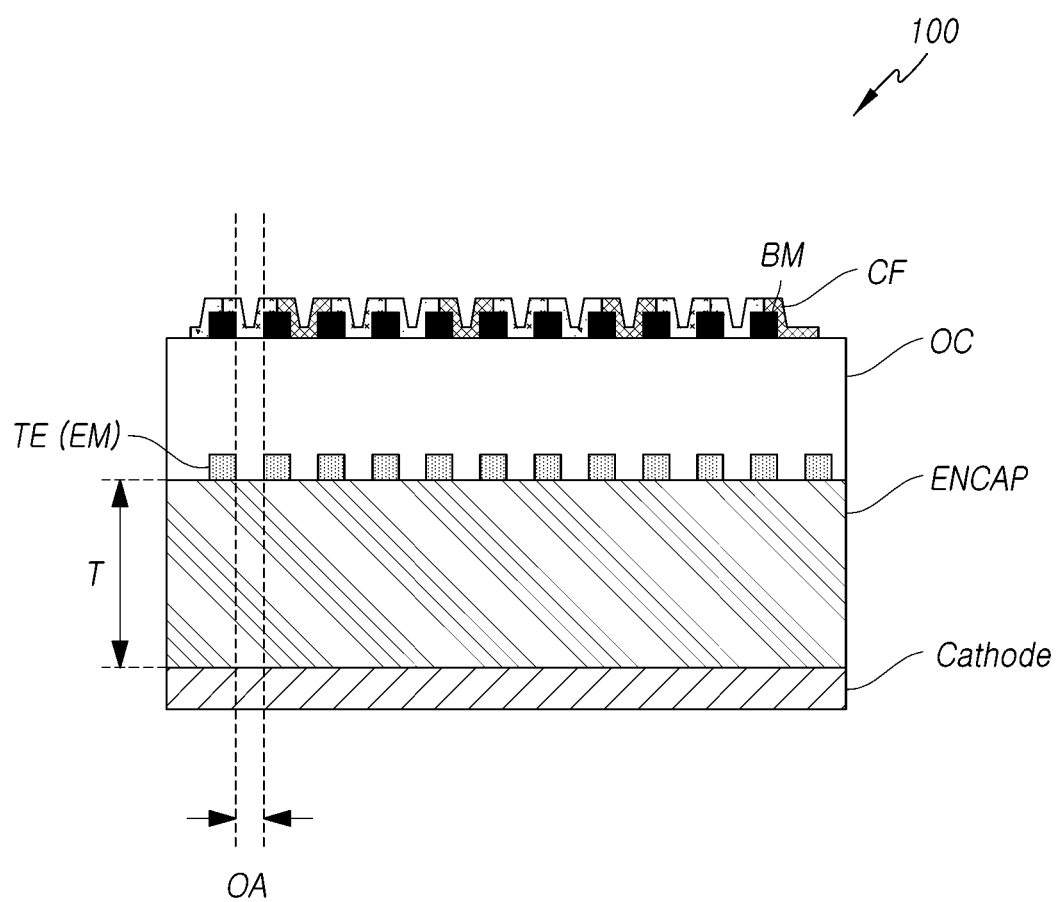
FIG. 12 is a cross-sectional view illustrating a first embodiment of a display device including a sensing unit according to the disclosure.
Figure 13:
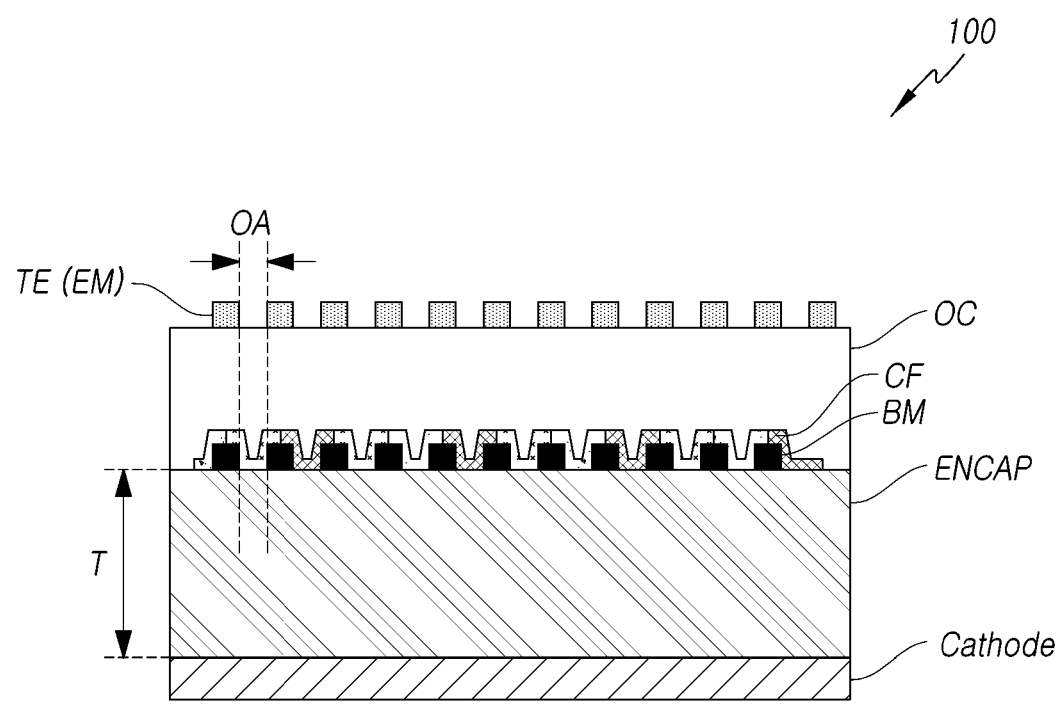
FIG. 13 is a cross-sectional view illustrating a second embodiment of the display device including a sensing unit according to the disclosure.

FIG. 12 is a cross-sectional view illustrating a first embodiment of a display device including a sensing unit according to the present disclosure, and FIG. 13 is a cross-sectional view illustrating a second embodiment of the display device including a sensing unit according to the present disclosure.

A sensing unit(s) TE, e.g., first and/or second electrodes TE1, TE2, may be integrated into, e.g., embedded in or mounted on, the display device 100 of FIG. 1. Here, the display device may be, e.g., an OLED display device using OLEDs, and when the sensing units TE are mounted on the display device, the sensing unit TE may be positioned between a second substrate ENCAP and a display cover. Also, the sensing units TE may be a plurality of electrodes and a plurality of signal lines having thereon a plurality of electrode regions. Further, as illustrated in FIG. 12, the sensing units TE may be disposed over the second substrate ENCAP, and as illustrated in FIG. 13, the sensor units TE may be disposed over the overcoat layer OC. That is, the sensor units TE may be integrated into, e.g., mounted on, the display device without using a separate touch panel.

Referring to FIG. 12, the sensing units TE may be formed over the second substrate ENCAP, and an overcoat layer OC may be formed over the sensing units TE. In addition, a black matrix BM may be disposed over the overcoat layer OC at a position corresponding to the electrode regions of the sensing units TE, and color filters CF may be disposed over the black matrix BM. A display cover (not illustrated) may be disposed over the color filters CF.

As described above, by forming the touch electrodes TE on the second substrate ENCAP, the touch electrodes TE can be formed without greatly affecting the display performance and the formation of the layers for the display.

Meanwhile, in the case of a touch-sensing method of a mutual capacitance type, there may be connection parts for connecting the driving electrodes and/or the sensing electrodes among the plurality of electrodes TE. The connection parts may be present in a layer that is different from the layer of the touch electrodes TE with an insulating film interposed therebetween.

For the convenience of description, FIG. 12 does not illustrate the connection parts and the insulating film between the touch electrodes TE and the connection parts.

Meanwhile, referring to FIG. 12, in the display device 1200, a cathode of the OLED may exist under the second substrate ENCAP.

The thickness T of the second substrate ENCAP may be, for example, 5 micrometers or more.

Parasitic capacitance formed between the cathode of the OLED and the touch electrodes of sensing unit TE may be reduced by designing the thickness of the second substrate ENCAP to be 5 micrometers or more. Thus, it is possible to prevent deterioration in touch sensitivity due to parasitic capacitance.

On the other hand, when the touch electrodes of sensing unit TE are formed of a mesh-type electrode metal EM having open regions OA, the position of each of the open regions OA may correspond to one or more sub-pixels or the positions of light-emitting units when viewed in the vertical direction.

Therefore, as illustrated in FIG. 12, the plurality of open regions OA may correspond to (overlap in projection) the plurality of color filters CF.

As described above, in an OLED display device, it is possible to provide a display device having excellent light-emitting performance by arranging the color filters CF, which are necessary in the case where white OLEDs or the like are used, to correspond to the open regions OA.

The vertical positional relationship between the color filters CF and the touch electrodes TE will now be described.

As described above, it is possible to provide a touch display device 100 having an optimal positional relationship between the color filters CF and the touch electrodes of sensing unit TE in consideration of display performance, such as light-emitting performance, and touch performance.

Meanwhile, attempts to incorporate a touch panel TSP including touch electrodes of sensing unit TE in a display panel 110 have been made in order to improve convenience in the manufacture of a touch display device 100 and to reduce the size of the touch display device 100.

However, there are considerable difficulties and many constraints to incorporating sensing units TE in a display device 100. For example, during the manufacturing process of a display device 100, there is a limit in that a high-temperature process for forming sensing units TE, which are generally made of a metallic material, inside a panel cannot be freely performed due to the presence of an organic material. Therefore, when the sensing units TE are formed over the overcoat layer OC, a high-temperature process can be performed more freely.

Referring to FIG. 13, in the display device 1300, a black matrix may be formed over the second substrate ENCAP, and color filters CF may be disposed over the black matrix BM. The overcoat layer OC may be formed over the color filters CF. In addition, the electrode pattern of the sensing units TE may be disposed over the overcoat layer OC at the positions corresponding to the black matrix BM. A display cover (not illustrated) may be disposed over the color filters CF.

Meanwhile, in the case of a touch-sensing method of a mutual capacitance type, there may be connection parts for connecting the driving electrodes and/or the sensing electrodes among the plurality of electrodes of sensing units TE. The connection parts may be present in a layer that is different from the layer of the touch electrodes of sensing units TE with an insulating layer interposed therebetween.

Figure 14:
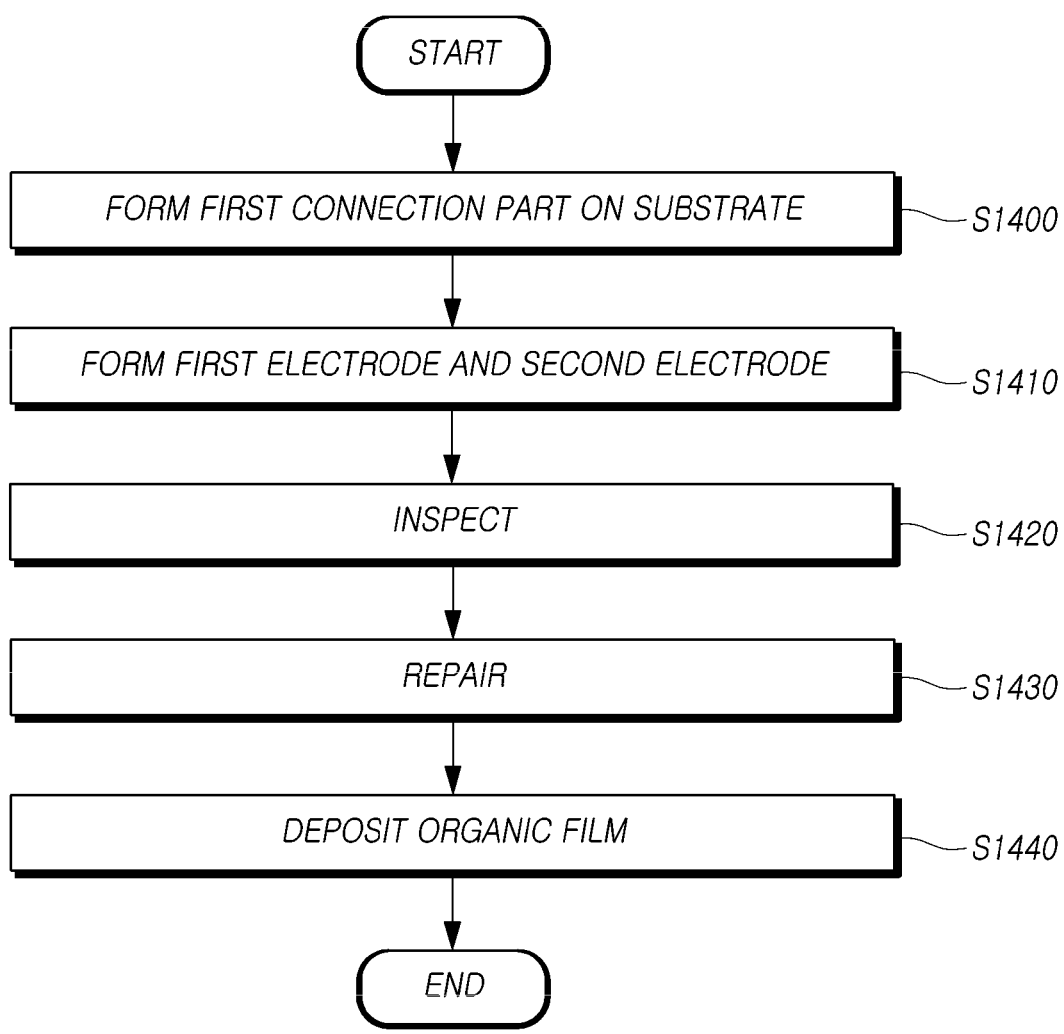
FIG. 14 is a flowchart illustrating a first embodiment of a method of manufacturing a display device according to the disclosure.

FIG. 14 is a flowchart illustrating a first embodiment of a method of manufacturing a display device according to the present disclosure.

Referring to FIG. 14, a method of manufacturing a display device may form a plurality of first connection parts by forming a first metal layer over a substrate and patterning the first metal layer in such a manner that among the plurality of first connection parts, at least one first connection part includes a first wiring and a second wiring and the first wiring and the second wiring have a predetermined distance therebetween (S1400).

The method may form a plurality of first electrodes and a plurality of second electrodes by depositing an insulating film over the substrate on which the first connection parts are formed, forming multiple vias in the insulation film, and then depositing and patterning a second metal layer over the insulation film (S1410). Among the plurality of first electrodes, two adjacent first electrodes are connected to the first wiring of a first connection part, each through one or more vias (S1410).

The connection between two adjacent first electrodes and one first connection part may be inspected (S1420). When it is determined that the connection is not defective, an insulating film may be deposited over the second metal layer. When it is determined in the inspection that two adjacent first electrodes and one first connection part are not connected, e.g., through the first wiring, repair may be performed in order to connect the two first electrodes using the second wiring (S1430). Accordingly, since it is possible to inspect a display device and to repair a defect before the completion of manufacturing the display device, the yield of the display device manufacturing can be increased and the manufacturing costs can be reduced.

Here, the defect may mean that a first wiring of a first connection part, which should be connected to first electrodes through a via hole, is cut off in the via by a foreign matter, or may mean that a first wiring and a second electrode(s), which should be separated from one another in an area through an insulating film, are connected to one another in the area by a foreign matter.

When the inspection is completed, an organic film is deposited over the first and second electrodes (S1440). After the organic film is deposited, inspection may be performed again.

The above description and the accompanying drawings provide an example of the technical idea of the present disclosure for illustrative purposes only. Those having ordinary knowledge in the technical field, to which the present disclosure pertains, will appreciate that various modifications and changes in form, such as combination, separation, substitution, and change of a configuration, are possible without departing from the essential features of the present disclosure. Therefore, the embodiments disclosed in the present disclosure are intended to illustrate the scope of the technical idea of the present disclosure, and the scope of the present disclosure is not limited by the embodiment. The scope of the present disclosure shall be construed on the basis of the accompanying claims in such a manner that all of the technical ideas included within the scope equivalent to the claims belong to the present disclosure.

What is claimed is:

1. A sensing unit, comprising:
a plurality of first electrodes disposed on a substrate;
a plurality of second electrodes disposed on the substrate; and
a plurality of first connection parts, each of which being disposed between two adjacent first electrodes among the plurality of first electrodes and including a first wiring and a second wiring separate from one another and at least one of the first wiring and the second wiring connecting the two adjacent first electrodes in a first direction;
wherein the first wiring includes a first connection pattern and the second wiring includes a second connection pattern,
wherein the first connection pattern is positioned beyond an outer periphery of the second connection pattern in the first direction, and
wherein the first connection pattern includes a first metal region and second metal region in parallel to the first metal region, a third metal region intersecting with the first and second metal regions, and a fourth metal region in parallel to the third metal region and intersecting with the first and second metal regions, wherein the third and the fourth metal regions extending beyond at least one of the first and the second metal regions.

2. The sensing unit of claim 1, wherein the first connection part includes two or more first wirings that are formed in a layer different from the plurality of first electrodes and are respectively connected to the two adjacent first electrodes through different vias, and a second wiring floating from the first wirings.

3. The sensing unit of claim 1, wherein the first wiring includes intersecting metal regions and an opening defined by the intersecting metal regions.

4. The sensing unit of claim 3, wherein the first wiring has a length shorter than that of the second wiring.

5. The sensing unit of claim 3, wherein the two adjacent first electrodes each includes electrode regions and openings within the electrode regions and wherein the opening of the first wiring overlaps in projection with one or more openings of an adjacent first electrode.

6. The sensing unit of claim 3, wherein the two adjacent first electrodes each includes electrode regions and openings within the electrode regions and wherein the intersecting metal regions of the first wiring overlap in projection with at least a portion of the electrode regions of an adjacent first electrode.

7. The sensing unit of claim 1, wherein the first wiring has a length longer than that of the second wiring in the first direction.

8. The sensing unit of claim 1, wherein the first connection pattern includes a plurality of intersecting metal regions defining a plurality of openings.

9. The sensing unit of claim 1, wherein the first connection pattern includes multiple metal regions formed in an L shape.

10. The sensing unit of claim 1, wherein the second connection pattern includes two L shaped metal regions.

11. The sensing unit of claim 1, wherein a first electrode of the plurality of first electrodes includes a first electrode region and a second electrode region, the second electrode region being separated from the first electrode region.

12. The sensing unit of claim 1, further comprising:
a plurality of second connection parts that are disposed in a layer that is different from that of the plurality of first connection parts, each of the second connection parts being disposed between two adjacent second electrodes among the plurality of second electrodes so as to connect the plurality of second electrodes in a second direction that is different from the first direction.

13. A display device, comprising:
a display panel including a first substrate and a second substrate over the first substrate; and
a sensing unit integrated into the display panel, the sensing unit including:
a plurality of first electrodes disposed over the second substrate; and
a first connection part disposed between two adjacent first electrodes among the plurality of first electrodes and the first connection part including a first wiring and a second wiring separate from one another, and at least one of the first wiring and the second wiring connecting the two adjacent first electrodes in the first direction, each through a via;
wherein the first wiring includes a first connection pattern and the second wiring includes a second connection pattern,
wherein the first connection pattern is positioned beyond an outer periphery of the second connection pattern in the first direction, and
wherein the first connection pattern includes a first metal region and second metal region in parallel to the first metal region, a third metal region intersecting with the first and second metal regions, and a fourth metal region in parallel to the third metal region and intersecting with the first and second metal regions, wherein the third and the fourth metal regions extending beyond at least one of the first and the second metal regions.

14. The display device of claim 13, wherein the first wiring and the second wiring are formed in a layer different from the plurality of first electrodes, and the second wiring floating from the first wiring.

15. The display device of claim 13, wherein the sensing unit further includes:
a plurality of second electrodes disposed on the second substrate, and
a plurality of second connection parts that are disposed in a layer that is different from that of the plurality of first connection parts, each of the second connection parts being disposed between two adjacent second electrodes among the plurality of second electrodes so as to connect the plurality of second electrodes in a second direction that is different from the first direction.

16. The display device of claim 13, wherein the first wiring includes a plurality of intersecting metal regions and an opening defined by the plurality of intersecting metal regions.

17. The display device of claim 13, further comprising one or more color filters disposed over the second substrate, and
wherein the sensing unit further includes one or more openings among the plurality of first electrodes, the one or more openings corresponding to the one or more color filters.

18. A display device, comprising:
a display panel including a substrate; and
a sensing unit integrated into the display panel, the sensing unit including:
a plurality of first electrodes disposed over the substrate; and
a first connection part disposed between adjacent first electrodes among the plurality of first electrodes and the first connection part including a first wiring and a second wiring separate from one another, at least one pair of the adjacent first electrodes being connected through at least one of the first wiring or the second wiring and at least another pair of the adjacent first electrodes being connected only through the second wiring;

wherein the first wiring includes a first connection pattern and the second wiring includes a second connection pattern, wherein the first connection pattern is positioned beyond an outer periphery of the second connection pattern in the first direction, and wherein the first connection pattern includes a first metal region and second metal region in parallel to the first metal region, a third metal region intersecting with the first and second metal regions, and a fourth metal region in parallel to the third metal region and intersecting with the first and second metal regions, wherein the third and the fourth metal regions extending beyond at least one of the first and the second metal regions.

* * * * *